United States Patent
Venkataraman et al.

(10) Patent No.: US 9,906,237 B1
(45) Date of Patent: Feb. 27, 2018

(54) DIGITAL-TO-ANALOG CONVERTER AND METHOD OF OPERATING

(71) Applicant: Texas Instruments Incorporated, Dallas, TX (US)

(72) Inventors: Jagannathan Venkataraman, Bangalore (IN); Eeshan Miglani, Madhya Pradesh (IN); Karthikeyan Gunasekaran, Tamil Nadu (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/582,355

(22) Filed: Apr. 28, 2017

(51) Int. Cl.
*H03M 1/10* (2006.01)
*H03M 3/00* (2006.01)
*H03M 1/74* (2006.01)
*H03M 1/12* (2006.01)
*H03M 1/00* (2006.01)

(52) U.S. Cl.
CPC ............. *H03M 3/38* (2013.01); *H03M 3/412* (2013.01); *H03M 3/436* (2013.01); *H03M 3/50* (2013.01); *H03M 1/00* (2013.01); *H03M 1/12* (2013.01); *H03M 1/747* (2013.01)

(58) Field of Classification Search
CPC ........... H03M 1/12; H03M 1/00; H03M 1/747
USPC .................. 341/120, 118, 110, 144, 122
See application file for complete search history.

(56) References Cited

U.S. PATENT DOCUMENTS 9,130,586 B1 * 9/2015 Raz .................. H03M 1/662

\* cited by examiner

*Primary Examiner* — Joseph Lauture
*Assistant Examiner* — Joseph J Lauture
(74) *Attorney, Agent, or Firm* — Gregory J. Albin; Charles A. Brill; Frank D. Cimino

(57) ABSTRACT

A digital-to-analog converter includes an adder having a plurality of inputs and an output coupled to the output of the converter. The converter further includes a plurality of digital-to-analog (DAC) elements, each DAC element has an output coupled to an input of the adder, and each DAC element has a DAC element input. A plurality of comparators have outputs coupled to a DAC element input. A first input of each comparator is coupled to the input of the converter. A second input of each comparator is selectively coupled to one of a predetermined voltage and a pseudo-random bit sequence (PRBS[n]).

19 Claims, 7 Drawing Sheets

DIGITAL-TO-ANALOG CONVERTER AND METHOD OF OPERATING

BACKGROUND

Delta-sigma (ΔΣ, DS, sigma-delta, ΣΔ) modulation is a method for encoding analog signals into digital signals and is implemented in some analog-to-digital converters (ADCs). Delta-sigma modulation is also used to convert high bit count, low-frequency digital signals into lower bit count, higher frequency digital signals as part of the process of converting digital signals into analog signals in some digital-to-analog converters (DACs). Delta-sigma ADCs have advanced to where they are now suitable for converting analog signals over a wide range of frequencies, such as from DC to several megahertz. In general, delta-sigma ADCs consist of an oversampling modulator followed by a digital/decimation filter that together produce a high-resolution data-stream over a wide frequency range.

A delta-sigma modulator is central to a delta-sigma ADC. The delta-sigma modulator digitizes the analog input signal and reduces noise at lower frequencies. The delta-sigma ADC implements a noise shaping function that pushes low-frequency noise up to higher frequencies where the noise is outside the frequency band of interest. Noise shaping is one of the reasons that delta-sigma ADCs are well-suited for low-frequency, high-accuracy measurements. In a conventional ADC, an analog signal is integrated, or sampled, with a sampling frequency and subsequently quantized in a multi-level quantizer into a digital signal, which introduces quantization error noise.

The first step in delta-sigma modulation is delta modulation, whereby the change in the analog signal (its delta) is encoded, rather than encoding the absolute value of the analog signal. The result is a stream of pulses, as opposed to a stream of numbers as is the case with pulse-code modulation. In delta-sigma modulation, the accuracy of the modulation is improved by passing the digital output through a 1-bit DAC and adding (sigma) the resulting analog signal to the input analog signal, thereby reducing the error introduced by the delta modulation.

In multi-bit, continuous time delta-sigma modulators, DAC static mismatch and inter symbol interference (ISI) cause degradation in the noise floor and the harmonic performance. Typically, dynamic element matching (DEM)/data-weighted-averaging (DWA) schemes are implemented to shape this noise out of the desired frequency band. However, in high speed delta-sigma ADCs, the extra delays in the DEM/DWA block create excess loop delay and cause instability in the modulator.

SUMMARY

A digital-to-analog converter includes an adder having a plurality of inputs and an output coupled to the output of the converter. The converter further includes a plurality of digital-to-analog (DAC) elements, each DAC element has an output coupled to an input of the adder, and each DAC element has a DAC element input. A plurality of comparators have outputs coupled to a DAC element input. A first input of each comparator is coupled to the input of the converter. A second input of each comparator is selectively coupled to one of a predetermined voltage and a pseudo-random bit sequence (PRBS[n]).

DETAILED DESCRIPTION

As previously noted, delta-sigma (ΔΣ, DS, sigma-delta, ΣΔ) modulation is a method for encoding analog signals into digital signals and is implemented in many applications including analog-to-digital converters (ADCs) and digital-to-analog converters (DACs). The description herein is focused in delta-sigma modulation implemented in ADCs, which are referred to as delta-sigma ADCs. A delta-sigma modulator first encodes an analog signal using high-frequency delta-sigma modulation. The delta-sigma modulator then applies a digital filter to generate a higher-resolution, but with a lower sample-frequency digital output. Conversely, a delta-sigma DAC encodes a high-resolution digital input signal into a lower-resolution, but a higher sample-frequency signal is mapped to voltages. The signal is smoothed with an analog filter to generate an analog output signal. In both cases, the temporary use of a lower-resolution signal simplifies circuit design and improves efficiency.

Figure 1:
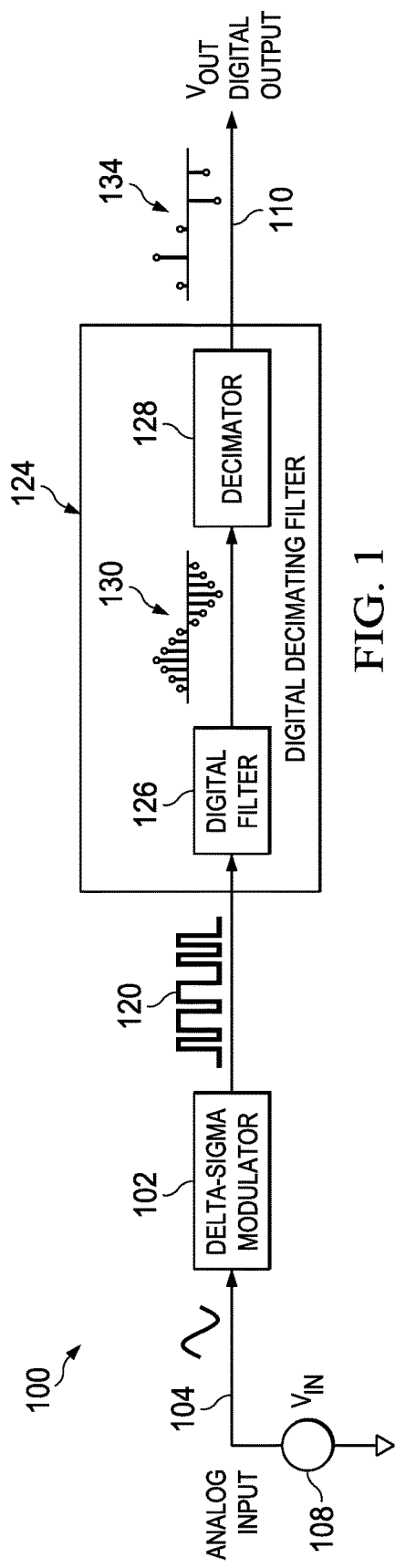
FIG. 1 is a block diagram of a multi-bit delta-sigma modulator implemented within an analog-to-digital converter (ADC).

FIG. 1 is a block diagram of a delta-sigma analog-to-digital converter (ADC) 100 implementing a multi-bit delta-sigma modulator 102. The ADC 100 includes an input 104 that receives an analog signal $V_{IN}$ from a signal or voltage source 108 during operation of the ADC 100. The ADC 100 has an output 110 where a digital output signal $V_{OUT}$ is present during operation of the ADC 100. The output signal $V_{OUT}$ is a digital signal that is representative of the analog signal $V_{IN}$. In the example of FIG. 1, the delta-sigma modulator 102 generates a signal 120 that is based on a sinusoidal analog signal $V_{IN}$. The signal 120 has pulses that are proportional to the amplitude of the analog signal $V_{IN}$. For example, delta-sigma modulator 102 may use pulse density modulation to generate signal 120 based on the input signal at input 104. In such an example, signal 120 may have a pulse density or average value that is proportional to the amplitude of the input signal. In single bit sigma-delta modulation (with only one DAC and quantizer) the signal 120 comprises pulses, because the delta-sigma modulator 102 has only two quantization levels, which are proportional to the amplitude of the input signal $V_{IN}$. In multi-bit delta-sigma modulation, the signal 120 has multiple quantized levels, so the signal 120 toggles close to the signal level at the output 110. Delta-sigma modulators described herein overcome errors in the signal 120 generated by DACs in the delta-sigma modulators.

The output of the delta-sigma modulator 102 is coupled to the input of a digital decimating filter 124 that includes a digital filter 126 and a decimator 128. The digital filter 126 converts the signal 120 to a sampled signal of the analog input signal $V_{IN}$ as shown by the signal 130. The signal 130 is sampled at a very high rate, which in many examples is much higher than the Nyquist rate of the input signal $V_{IN}$. The decimator 128 reduces the sampling rate to generate an output signal 134, which, in the example of FIG. 1, is the output signal $V_{OUT}$ of the ADC. As shown in FIG. 1, the output signal 134 has a lower sampling rate than the signal 130. Accordingly, the decimating filter 124 reduces the noise in the output signal 134 by pushing it out of the frequency band of the output signal 134.

Figure 2:
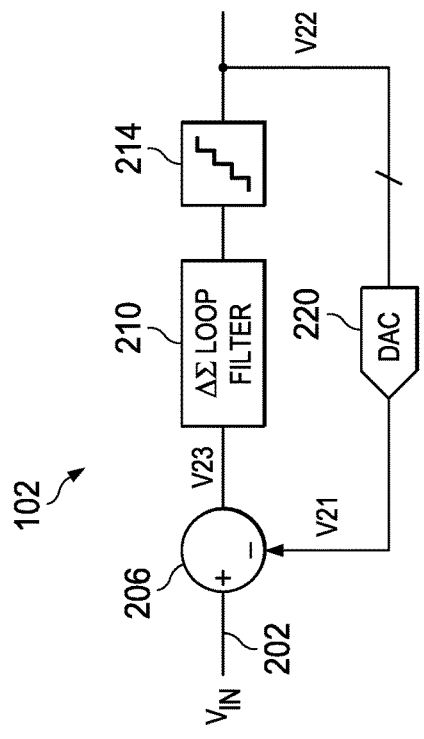
FIG. 2 is a block diagram of the delta-sigma modulator of FIG. 1.

FIG. 2 is a block diagram of an example of a delta-sigma modulator, which may include the delta-sigma modulator 102 of FIG. 1. The delta-sigma modulator 102 includes an input 202 that is coupled to the input 104 of the ADC 100 of FIG. 1 so as to receive the input signal $V_{IN}$. The input 202 is coupled to an adder 206 that subtracts a signal V21 from the input signal $V_{IN}$. The signal V21 may be an impulse-type signal having a magnitude that is proportional to a signal V22 output by the modulator 102. The signal 120 of FIG. 1 is an example of the signal V22. A signal V23 generated by the adder 206 is representative of the amount that the input signal $V_{IN}$ has changed over a period. More specifically, the input signal $V_{IN}$ is processed by the delta-sigma modulator 102 and the signal V21, which has a magnitude proportional to the signal V22, is subtracted from the input signal $V_{IN}$. Accordingly, the signal V23 is representative of the amount of change in the input signal $V_{IN}$ that occurred during the processing or during a period.

The output of the adder 206 is coupled to the input of a delta-sigma (ΔΣ) loop filter 210, which is followed by a quantizer 214. The combination of the filter 210 and the quantizer 214 generates signals having amplitudes proportional to those of the signal V23. The delta-sigma modulator 102 is a multi-bit device, so it has several data lines, each representative of a bit of the output signal $V_{OUT}$. The output of the quantizer 214 is coupled to the input of a DAC 220. The DAC 220 converts the signal output from the quantizer 214 to the analog voltage V21. The aforementioned components constitute a negative feedback loop with high gain in the filter 210 in the frequency band of interest, which results in the voltage V21 being almost equal to the input voltage $V_{IN}$ in the frequency band of interest. Since the voltage V22 is a digital representation of the voltage V21, the voltage V22 is an accurate digital representation of the input voltage $V_{IN}$ in the frequency band of interest. It is noted that the accuracy with which the voltage V22 matches the voltage V21 depends on the accuracy of the DAC 220.

Figure 3:
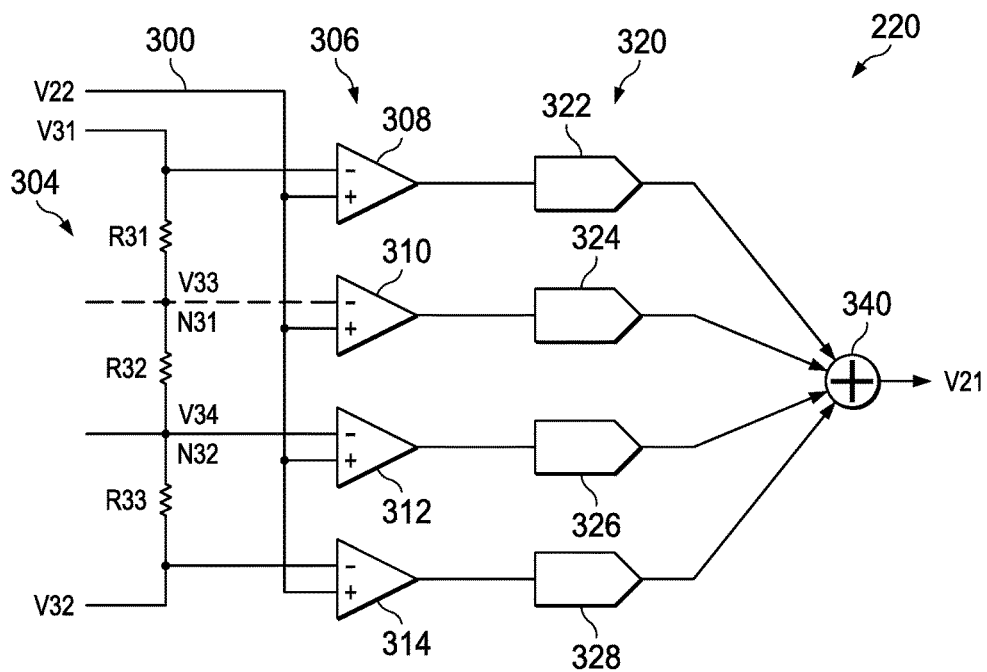
FIG. 3 is a block diagram of the ADC in the delta-sigma modulator of FIG. 2.

FIG. 3 is a block diagram of an example of the multi-bit DAC 220 of FIG. 2. The DAC 220 has an input 300 that is coupled to the voltage V22, which is a quantized signal. The DAC 220 has a resistor network 304 coupled between two voltages V31 and V32. The voltage V31 corresponds to the highest voltage in the signal V22 (e.g., the highest voltage produced by quantizer 214) and the voltage V32 corresponds to the lowest voltage in the signal V22 (e.g., the lowest voltage produced by quantizer 214). In the example of FIG. 3, the resistor network 304 has three resistors, R31, R32, and R33, but the number of resistors may vary as a design choice. A node N31 is located between resistors R31 and R32 and has a voltage V33 during operation of the DAC 220. A node N32 is located between resistors R32 and R33 and has a voltage V34 during operation of the DAC 220.

A plurality of comparators 306 have first inputs (non-inverting inputs) that are coupled to the input 300 and second inputs (inverting inputs) that are coupled to the above-described voltages in the resistor network 304. A first comparator 308 has its second input coupled to the voltage V31, a second comparator 310 has its second input coupled to the node N31, a third comparator 312 has its second input coupled to the node N32, and a fourth comparator 314 has its second input coupled to the voltage V32.

The outputs of the comparators 306 are coupled to inputs of a plurality of digital-to-analog converters (DACs) 320 that are sometimes referred to as individual DAC elements. A first DAC 322 is coupled to the output of the first comparator 308, a second DAC 324 is coupled to the output of the second comparator 310, a third DAC 326 is coupled to the output of the output of the third comparator 312, and a fourth DAC 328 is coupled to the output of the fourth comparator 314. The outputs of the DACs 320 are all coupled to an adder 340 that outputs the voltage V21.

The DACs 320 are subject to mismatch and inter-symbol interference (ISI) between the DACs 320. These mismatches and the ISI cause errors in the signal V21, which limits the performance of the ADC 100, FIG. 1. The ISI yields dynamic errors that are dependent on the switching pattern of the DACs 320. Nonlinear functions of the dynamic errors are modulated with analog impairments such as capacitance mismatch between switches of the DACs 320 and switch offsets that generate errors in the signals generated by the ADC 100.

Figure 4:
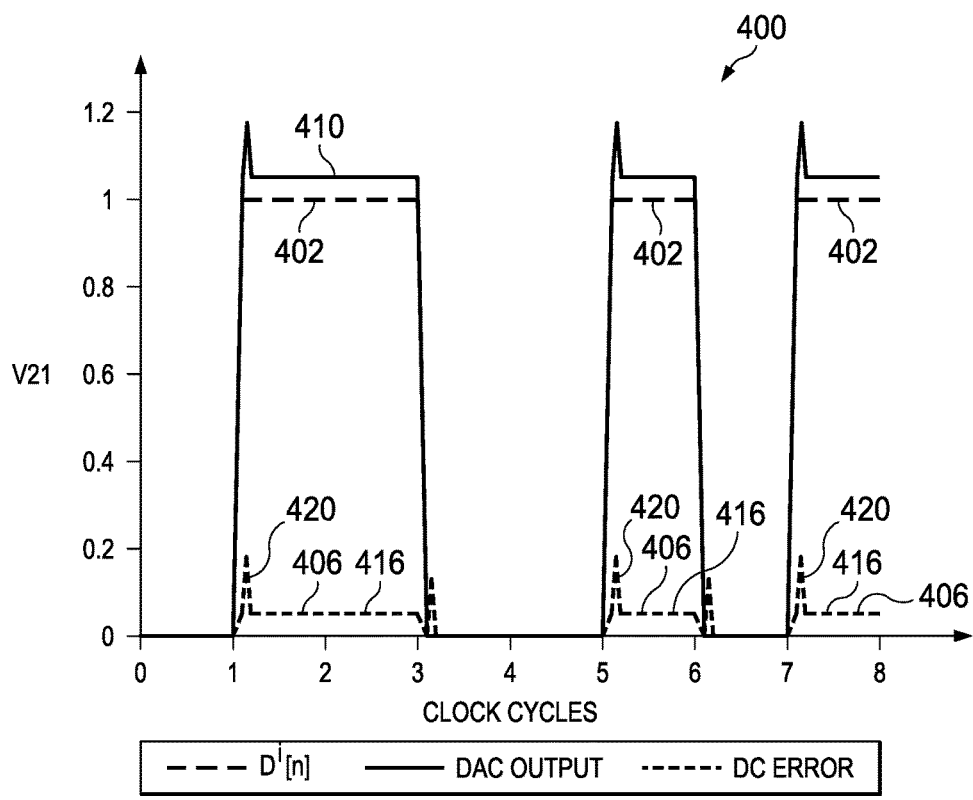
FIG. 4 is a graph showing errors in the output signal as a function of clock cycles due to the dynamic errors and the mismatch in the DACs of FIG. 3.

FIG. 4 is a graph 400 showing errors in the output signal V21 of FIG. 3 as a function of clock cycles. Mismatch in the DACs 320 of FIG. 3 causes static errors and inter-symbol interference (ISI) causes dynamic errors as described herein. A graph 402 (dashed line) shows the output signal of the DACs 320 as a function of time with no errors or as an ideal situation. A graph 406 shows an example of error induced on the signal V21. A graph 410 shows the actual signal V21 with the errors of the graph 406 combined with the ideal signal of the graph 402. The graph 406 shows two errors introduced by the DACs 320, static error 416 caused by mismatch and dynamic error 420 caused by ISI. The static error 416 occurs during periods in which at least one DAC of the DACs 320 is active. The active DAC outputs a voltage when it is active, which is the voltage represented by the error 416. The dynamic error 420 occurs during transitions of the DAC from active to inactive, or inactive to active states. Both errors are due to mismatches in the DACs 320. The total error of graph 406 is defined by equation (1) as follows:

$$\text{Total Error} = \Delta_{mismatch,i} \times D^i[n] + \Delta_{ISI,i} \times |D^i[n] - D^i[n-1]| \quad \text{Equation (1)}$$

where $D^i[n]$ is a digital bit controlling the $i^{th}$ DAC in the $n^{th}$ clock cycle. When $D^i[n]$ equals 1, the DAC is active in the $n^{th}$ clock cycle. When $D^i[n]$ equals 0, the DAC is inactive in $n^{th}$ clock cycle. Thus, the mismatch error $\Delta_{mismatch}$ occurs only when the DAC is active or when $D^i[n]=1$. This part of the total error can be written as $\Delta_{mismatch,i} \times D^i[n]$. The function to represent transition from active to inactive or inactive to active is $|D^i[n]-D^i[n-1]|$ and at every transition an $\Delta_{ISI,i}$ error is introduced, so the expression for this error is shown as equation (2) as follows:

$$\Delta_{ISI,i} \times |D^i[n] - D^i[n-1]| \quad \text{Equation (2)}$$

The delta-sigma modulators and modulation methods described below cancel the errors described with reference to FIG. 4.

Figures 5, 7:
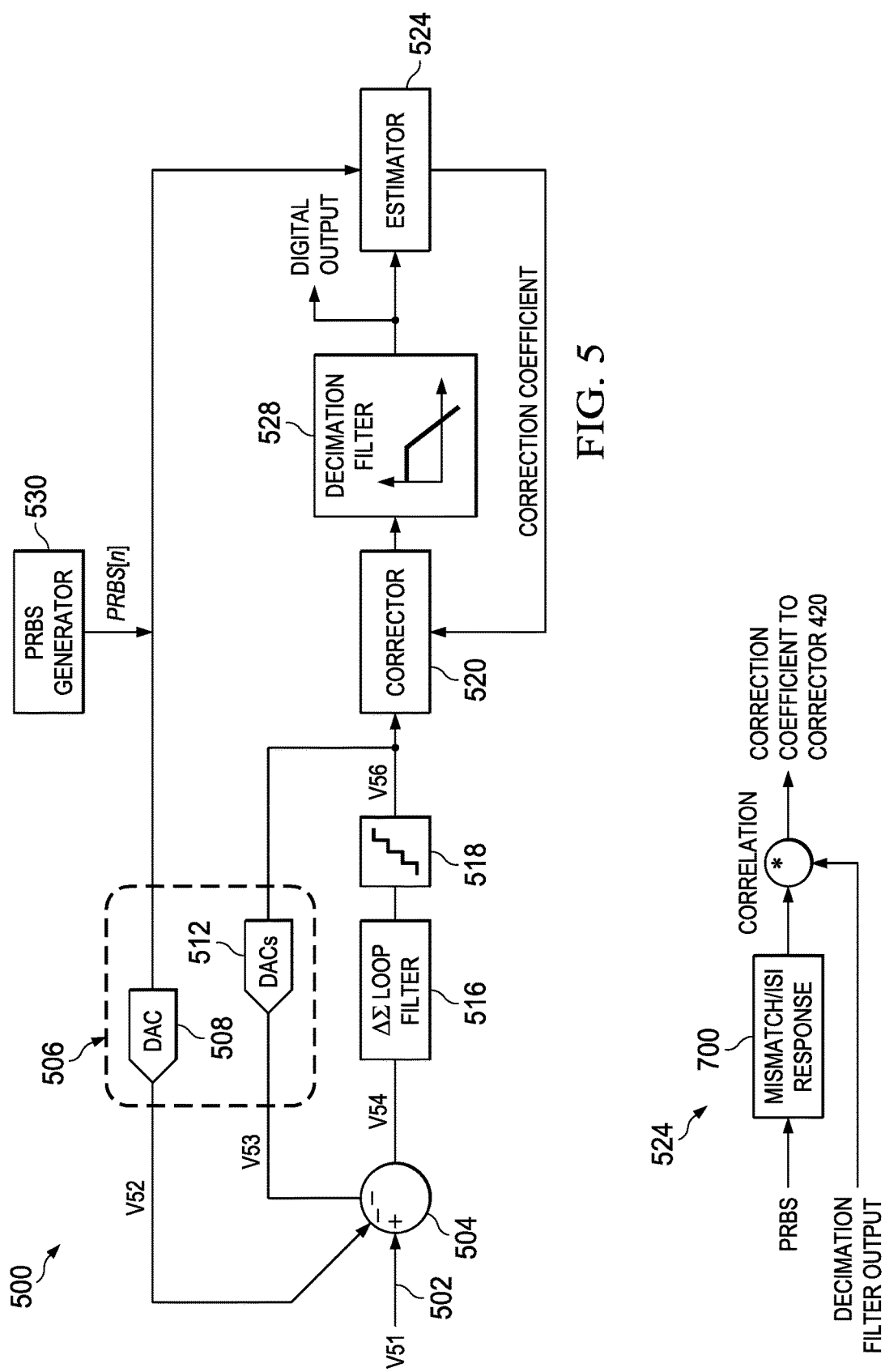
FIG. 5 is a block diagram of an example of a delta-sigma modulator that overcomes the problems detailed in the graph of FIG. 4.
FIG. 7 is a block diagram of an example of the estimator in the delta-sigma modulator of FIG. 5.

FIG. 5 is a block diagram of an example of a delta-sigma modulator 500 that overcomes the problems detailed in the graph 400 of FIG. 4. In summary, in-line background estimation of the static and dynamic errors is performed to correct for these errors. The estimation does not introduce excess loop delay in the critical loop of the delta-sigma modulator 500. An extra DAC, or DAC element, that has an input coupled to a pseudo-random bit sequence (PRBS[n]) is included in the modulator 500. The output of the delta-sigma modulator 500 is convolved with the PRBS[n] to estimate the DAC mismatch.

The modulator 500 has an input 502 that receives an analog signal V51, which may be the signal $V_{IN}$ in FIG. 1. The input 502 is coupled to an analog adder 504. The modulator 500 includes a DAC 506 that includes several DACs or DAC elements. The analog output of a DAC 508 is coupled to an input of the adder 504 so that the output signal V52 of the DAC 508 is subtracted from the signal V51 at the input 502. Another input of the adder 504 is coupled to the output of a DAC 512 that has a plurality of DACs located therein and that functions in a manner similar to the DAC 220 of FIG. 2. Accordingly, the DAC 512 includes a plurality of individual DAC elements. As described in greater detail below, the DAC 508 substitutes for one DAC element at a time in the DAC 512. The signal V52 is output by the DAC 508, a signal V53 is output by the DAC 512, and a signal V54 is output by the adder 504.

The output of the adder 504 is coupled to the input of a delta-sigma loop filter 516 that functions in the same manner as the delta-sigma loop filter 210 of FIG. 2. The output of the delta-sigma loop filter 516 is coupled to a quantizer 518 that generates a signal V56. The signal V56 is input to the DAC 512 and a corrector 520. The corrector 520 receives another input from an estimator 524 as described in greater detail below. The corrector 520 adjusts the output of the delta-sigma loop filter 516 (and/or the quantizer 518) to correct for the dynamic errors 420, FIG. 4, and the static errors 416. The corrector 520 outputs a digital signal to a decimation filter 528 that is significantly similar to the decimation filter 124 of FIG. 1. The decimation filter 528 pushes the noise in the signal V56 past the frequency bands in which the modulator 500 operates. The estimator 524 receives the output of the decimation filter 528 and generates a signal for the corrector 520 based on the input from the decimation filter 528 and a PRBS[n] generated by a PRBS generator 530. The PRBS generator 530 is also coupled to the input of the DAC 508. In other examples, digital signal generators other than a PRBS generator may be implemented in the modulator 500.

Figure 6:
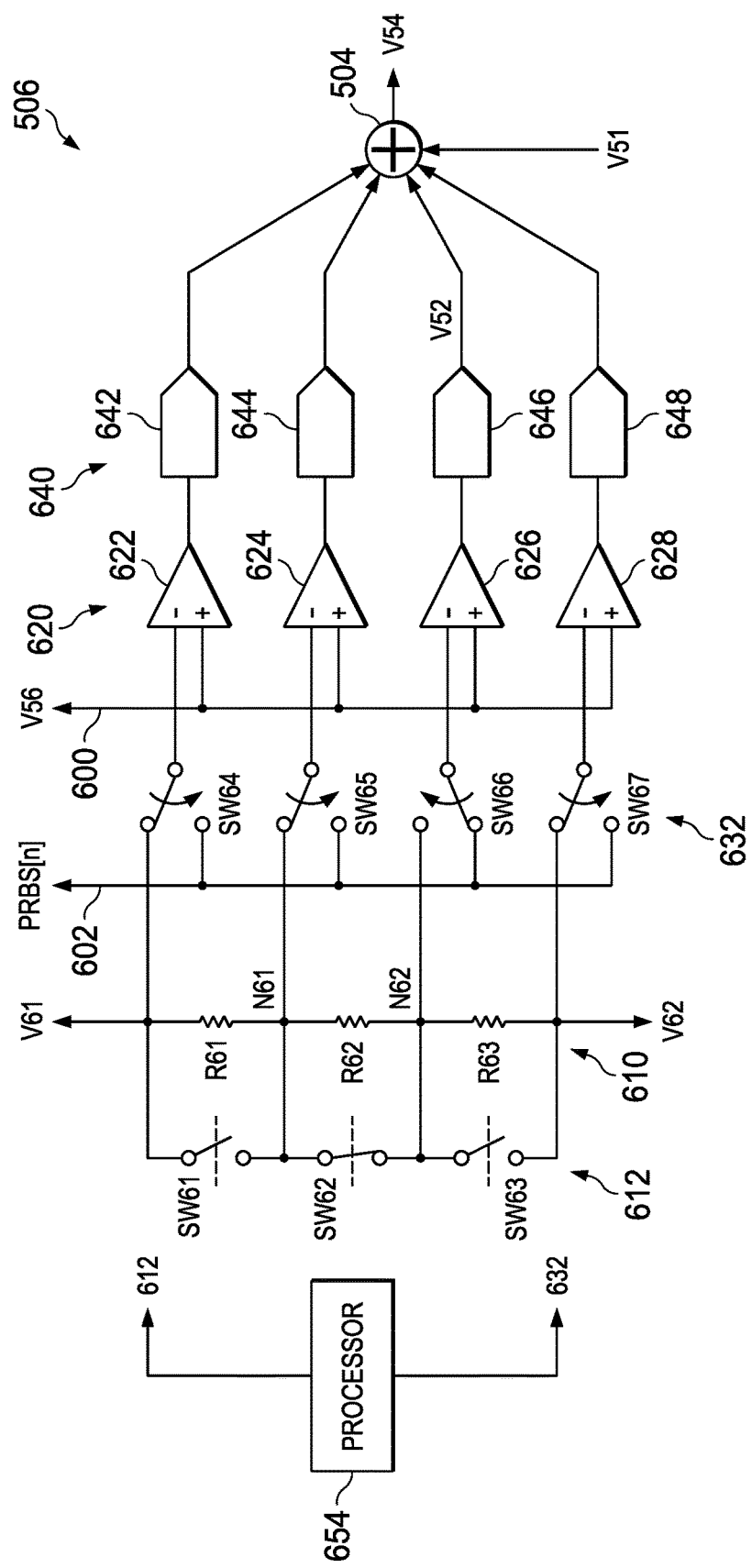
FIG. 6 is a block diagram of an example of the DAC in the delta-sigma modulator of FIG. 5.

FIG. 6 is a block diagram of an example of the DAC 506 in the delta-sigma modulator 500 of FIG. 5. The DAC 506 has a first input 600 that is coupled to the signal V56 that is output from the quantizer 518. Another input 602 is coupled to the PRBS generator 530 and receives the PRBS[n]. A resistor array 610 is coupled between a voltage V61 and a voltage V62, which may be the highest value of the PRBS[n] and ground, respectively. The resistor array 610 includes resistor R61, resistor R62, and resistor R63. A switch array 612 is coupled in parallel with the resistor array 610 to selectively shunt or short individual resistors in the resistor array 610. The switch array 612 includes a switch SW61 coupled in parallel with resistor R61, a switch SW62 coupled in parallel with resistor R62, and a switch SW63 coupled in parallel with resistor R63. A node N61 is located between resistor R61 and resistor R62 and a node N62 is located between resistor R62 and resistor R63.

A plurality of comparators 620 have first inputs (non-inverting inputs in the example of FIG. 6) coupled to the input 600, which is coupled to the signal V56. The comparators 620 include a first comparator 622, a second comparator 624, a third comparator 626, and a fourth comparator 628. An array of switches 632 selectively couple second inputs (inverting inputs in the example of FIG. 6) of the comparators 620 to the input 602 or the resistor array 610. Accordingly, the inverting inputs of the individual comparators are coupled to either the PBSR or fixed voltages from the resistor array 610. The switches 632 include a switch SW64 coupled to the first comparator 622, a switch SW65 coupled to the second comparator 624, a switch SW66 coupled to the third comparator 626, and a switch SW67 coupled to the fourth comparator 628.

The outputs of the comparators 620 are coupled to a plurality of DACs 640, which include a first DAC 642, a second DAC 644, a third DAC 646, and a fourth DAC 648. In an ideal situation, the DACs 640 should all be equal, meaning that they output identical voltages for given inputs and their reaction times are equal. One of the DACs 640 serves as the DAC 508 of FIG. 5, which is also referred to as the extra DAC. The DAC 508 is the DAC that is coupled to receive the PRBS[n] from the PRBS generator 530. Accordingly, although FIG. 6 includes four DACs 640 and four comparators 620, only three of them are used for decoding purposes. One of the DACs 640 and one of the comparators 620 are used for calibration and/or determining the errors in the DACs 640, and are coupled to the PRBS[n]. The outputs of the DACs 640 are coupled to the inputs of the adder 504 and the output of the adder 504 is the signal V54.

The switches 612 and 632 described herein are controlled by a processor 654, which determines the states of the switches 612 and 632. Under normal decoding, the switches 612 are open and the switches 632 are set to couple the second inputs of the comparators 620 to the resistor array 610. As shown in FIG. 6, the switch SW62 is closed and the switch SW66 is set to couple the third comparator 626 to the input 602 to receive the PRBS[n]. Switch SW62 is closed and switch SW66 is set to remove the third comparator 626 and the third DAC 646 from the decoding, so the third DAC 646 is functioning as the DAC 508, FIG. 5. The remaining comparators and DACs perform the decoding without being affected by the removal of the third comparator 626 and the third DAC 646. In this configuration, the third comparator 626 will either output a high (logic 1) or a low (logic 0) voltage to the third DAC 646 depending on the state of the PRBS[n]. It follows that the third DAC 646 should output zero volts when the third comparator 626 outputs a logic 0 and the third DAC 646 should output a high voltage, such as a maximum voltage, when the third comparator 626 outputs a logic 1. The signal V54 is analyzed as described below to determine the static and/or dynamic error of the third DAC 646 and to correct for the error as described further below.

FIG. 7 is a block diagram of an example of the estimator 524 of FIG. 5. The estimator 524 receives the PRBS[n] from the PRBS generator 530, FIG. 5, at a mismatch/ISI response generator 700. The output of the decimation filter 528 and the output of the generator 700 are correlated together to generate a correction coefficient that is transmitted to the corrector 520. As described herein, the correction coefficient generated by the estimator 524 is used by the corrector 520 to cancel the dynamic and/or static errors for each of the DAC elements in the DAC 506. Dynamic errors are injected during every transition of the DAC elements 640, FIG. 6, so the DAC element controlled by the PRBS[n] (DAC 646 in FIG. 6) injects dynamic error with a waveform |PRBS[n]−PRBS[n−1]|, where ‖ represents a modulus function, as the signal V52. The signal V52 is injected into the adder 504 so as to be subtracted from the other signals. The signal V54 undergoes transfer functions of STF(n) (signal transfer function) and decimation filter transfer functions, filter(n). Thus, the output signal has a function per equation (3) as follows:

$$\text{OUTPUT} = -|\text{PRBS}[n] - \text{PRBS}[n-1]| \times \Delta_{dynamic,i} * \text{stf}[n] * \text{filter}[n] \quad \text{Equation (3)}$$

where $\Delta_{dynamic,i}$ is the dynamic error of the DAC element i, which is currently controlled by the PRBS[n]. Similarly for mismatch error $\Delta_{mismatch,i}$ the output signal is proportional to the PRBS[n] and has a function per equation (4) as follows:

$$\text{OUTPUT} = -\text{PRBS}[n] \times \Delta_{mismatch,i} * \text{stf}[n] * \text{filter}[n] \quad \text{Equation (4)}$$

Based on equations (3) and (4), the total output with the PRBS[n] is given by equation (5) as follows:

$$\text{TOTAL OUTPUT} = -|\text{PRBS}[n] - \text{PRBS}[n-1]| \times \Delta_{dynamic,i} * \text{stf}[n] * \text{filter}[n] - \text{PRBS}[n] \times \Delta_{mismatch,i} * \text{stf}[n] * \text{filter}[n] + V51 * \text{stf}[n] * \text{filter}[n] \quad \text{Equation (5)}$$

In order to determine the variable $\Delta_{dynamic,i}$, the total output is correlated with $|\text{PRBS}[n]-\text{PRBS}[n-1]|*\text{stf}[n]*\text{filter}[n]$. In order to determine $\Delta_{mismatch,i}$, the total output is correlated with $\text{PRBS}[n]*\text{stf}[n]*\text{filter}[n]$. Because PRBS[n] and $|\text{PRBS}[n]-\text{PRBS}[n-1]|$ have no correlation, the two errors, static and dynamic, can be determined together. Once $\Delta_{mismatch,i}$ and $\Delta_{dynamic,i}$ are determined for each DAC element, they are used to correct the DAC error in the corrector 520. One such operation the corrector 520 may perform is provided by equation (6), which corrects the error introduced by DAC mismatch and dynamic errors as follows:

$$\text{Output} = V56 + \Sigma D_i[n]\Delta_{mismatch,i} + \Sigma |D_i[n] - D_i[n-1]||\Delta_{dynamic,i} \quad \text{Equation (6)}$$

Reference is made to FIGS. 5, 6, and 7 for a description of the operation of the delta-sigma modulator 500. The PRBS generator 530 generates the PRBS[n], which is output to the estimator 524 and the DAC 508. The processor 654 determines which of the DACs 640 will receive the PRBS[n] so as to be used for error estimation as the DAC 508. In the example of FIG. 6, the processor 654 has closed switch SW62 and placed switch SW66 in a state where the second comparator 626 receives the PRBS[n]. The individual bits in the PRBS[n] will either drive the output of the comparator 624 to logic 1 or logic 0 levels.

The third DAC 646 functions as the DAC 508 and it ideally outputs a high voltage when it receives a logic 1 and zero volts when it receives a logic 0 from the comparator 626. The effects of the PRBS[n] on the third DAC 646 are passed to the corrector 520 as the signal V56. More specifically, the effects of the PRBS[n] are encoded as the digital data generated by the loop filter 516 and the quantizer 518, which is received by the corrector 520. Initially, the effects of the PRBS[n] have not been analyzed, so there is no correction coefficient transmitted to the corrector 520. In situations where analysis has been completed, the corrector 520 applies correction to the digital data generated by the loop filter 516 and the quantizer 518 to offset for static and/or dynamic errors. For example, the corrector 520 may apply equation (6) to offset or correct for the static and dynamic errors.

In the example of FIG. 5, the decimation filter 528 is located after the corrector 520 so as to perform the decimation operations on the data that has been corrected by the corrector 520. As described above, the decimation filter 528 reduces the sampling rate, which reduces the in-band noise or pushes the noise in the digital signal outside of the operating band of the delta-sigma modulator 500. The estimator 524 receives the signal output by the decimation filter 528 and the PRBS[n] and generates a correction coefficient based on these two signals. The correction coefficient is applicable to individual bits generated by the loop filter 516. For example, during the above-described process, the correction coefficient is applied to the data based on the third DAC 646 being driven by the PRBS[n].

Figure 8:
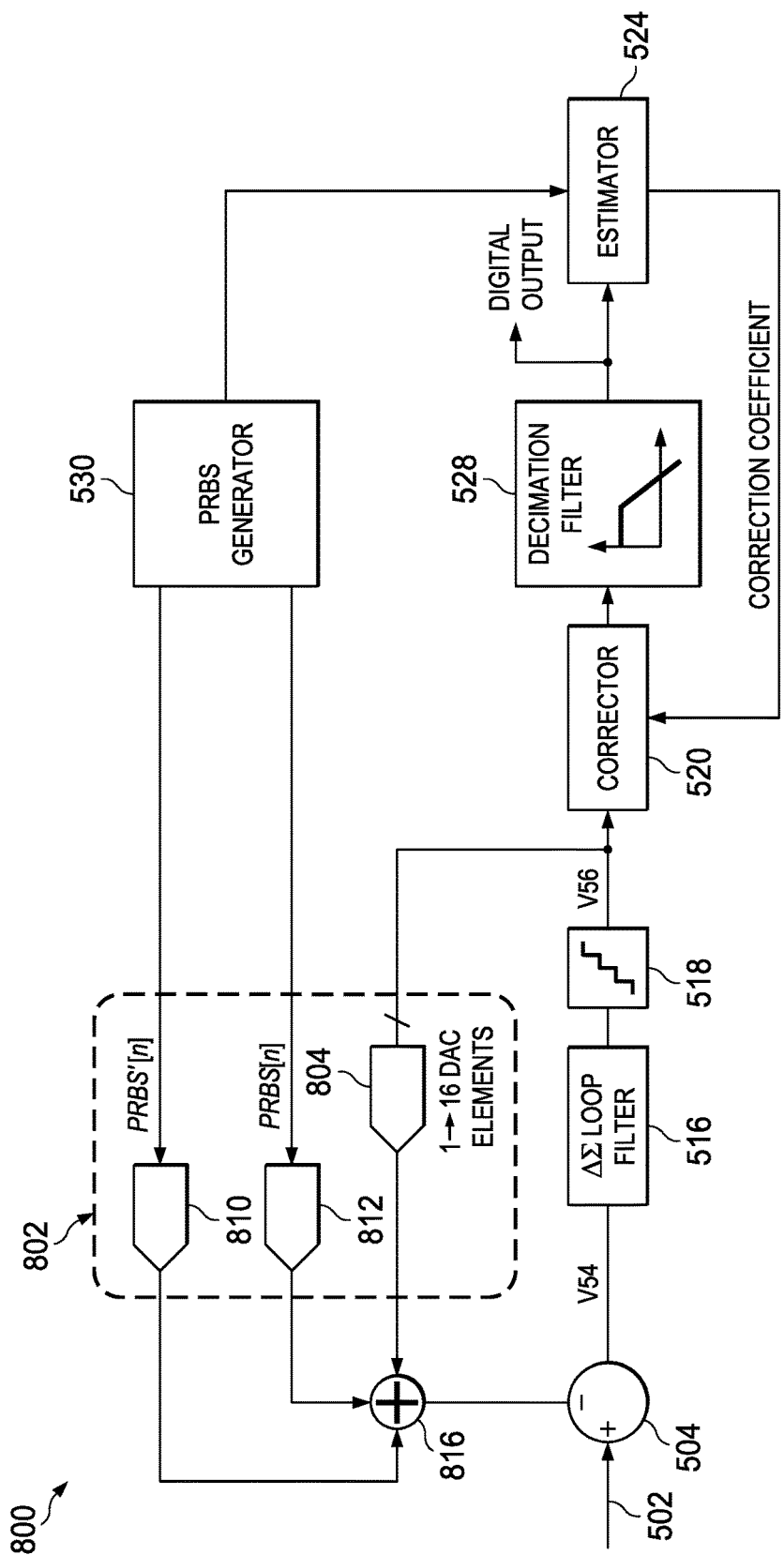
FIG. 8 is a block diagram of an example of a delta-sigma modulator that corrects for dynamic errors.

FIG. 8 is a block diagram of an example of a delta-sigma modulator 800 that corrects for dynamic errors 420 shown in the graph 406 of FIG. 4 based on complementary PRBS[n]. The dynamic errors 420 result from the switching transitions in the DAC elements during transitions of the clock signals as shown by the dynamic errors 420 in the graph 406 of FIG. 4. The delta-sigma modulator 800 includes many of the same components in the delta-sigma modulator 500 of FIG. 5 and these components are referenced by the same reference numerals. The delta-sigma modulator 800 includes a DAC 802 that has DAC elements 804 and two additional DAC elements, a first DAC element 810 and a second DAC element 812.

The first DAC 810 processes a PRBS'[n] and the second DAC 812 processes a PRBS[n] generated by the PRBS generator 530. The analog outputs of the DAC elements 804, 810 and 812 are input to an adder 816. The output of the adder 816 is input to the adder 504. One of the DAC elements 810/812 receives a logic 1 signal and the other DAC element 810/812 receives a logic 0 signal, so their outputs should cancel each other rendering zero volts. However, due to dynamic errors in the DAC elements, the outputs of DACs 810 and 812 may not cancel each other. As shown by the graph 406, dynamic errors 420 occur due to ISI mismatch. The estimator 524 determines the effects of the ISI errors and generates a correction coefficient for every bit of the output of the loop filter 516 to correct for the error. The corrector 520 applies the correction coefficients prior to the decimation filter 528, which attenuates the errors.

Figure 9:
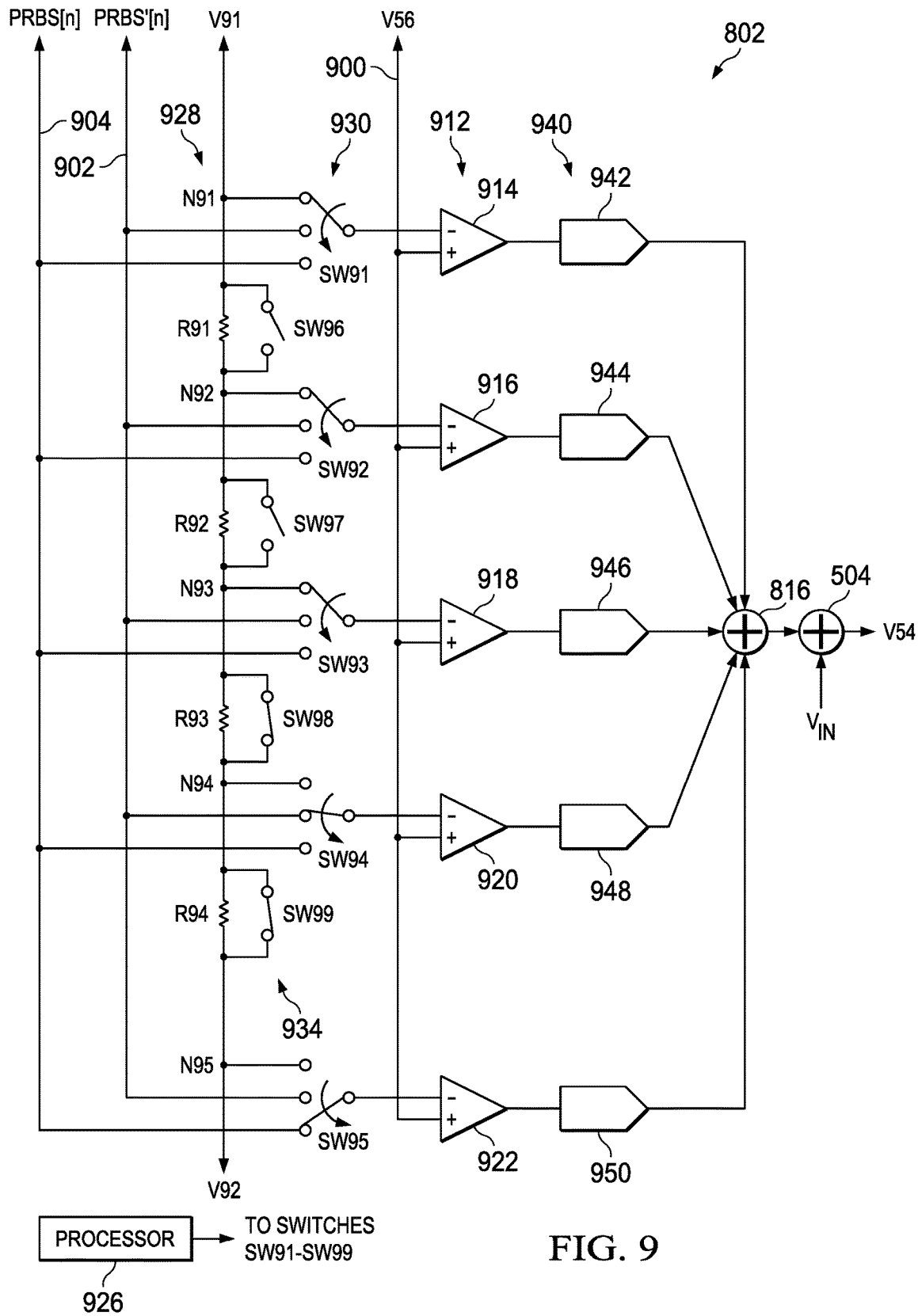
FIG. 9 is a block diagram of an example of a DAC implemented in the delta-sigma modulator of FIG. 8.

FIG. 9 is a block diagram of an example of the DAC 802. The DAC 802 is similar to the DAC 512 of FIG. 6, except the DAC 802 includes two extra DAC elements, shown in FIG. 8 as the DAC elements 810 and 812. One DAC element processes the PRBS[n] and to other DAC element processes the PRBS'[n]. The DAC 802 includes an input 900 that is coupled to the signal V56. An input 902 is coupled to the PRBS'[n] and an input 904 is coupled to the PRBS[n]. The input 900 is coupled to first inputs of a plurality of comparators 912. In the example of FIG. 9, the first inputs are non-inverting inputs of the comparators 912. The comparators 912 include a first comparator 914, a second comparator 916, a third comparator 918, a fourth comparator 920, and a fifth comparator 922.

A resistor array 928 is coupled between a voltage V91 and a voltage V92. The voltage V91 may be the same as the highest voltage of the PRBS[n] and the voltage V92 may be ground. The resistor array 928 includes four resistors, referred to individually as R91, R92, R93, and R94. A plurality of nodes are located in the resistor array 928. A node N91 is coupled to the voltage V91, a node N92 is coupled between resistor R91 and resistor R92, a node N93 is coupled between resistor R92 and resistor R93, a node N94 is coupled between resistor R93 and resistor R94, and a node N95 is coupled to the source V92.

A plurality of switches 930 couple second inputs (inverting inputs) of the comparators 912 to the signal V56, the PRBS[n], or the PRBS'[n]. The switches include a switch SW91 coupled to the first comparator 914, a switch SW92 coupled to the second comparator 916, a switch SW93 coupled to the third comparator 918, a switch SW94 coupled to the fourth comparator 920, and a switch SW95 coupled to the fifth comparator 922. A plurality of switches 934 are coupled in parallel with individual resistors in the resistor array 928 and shunt or short individual resistors in the resistor array 928. A switch SW96 is coupled in parallel with resistor R91, a switch SW97 is coupled in parallel with resistor R92, a switch SW98 is coupled in parallel with resistor R93, and a switch SW99 is coupled in parallel with resistor R94. A processor 936 controls the states of the switches SW91-SW99.

The outputs of the comparators 912 are coupled to the inputs of a plurality of DAC elements 940. A first DAC element 942 is coupled to the output of the first comparator 914, a second DAC element 944 is coupled to the output of the second comparator 916, a third DAC element 946 is coupled to the output of the third comparator 918, a fourth DAC element 948 is coupled to the output of the fourth comparator 920, and a fifth DAC element 950 is coupled to the output of the fifth comparator 922. The outputs of the DAC elements 942 are coupled to the inputs of the adder 816.

In the example DAC 802, the fourth DAC element 948 is processing the PRBS'[n] and the fifth DAC element 950 is processing the PRBS[n] as noted by the states of the switches SW94 and SW95, which are set by the processor 936. More specifically, the DAC elements 948 and 950 are converting the PRBS'[n] and PRBS[n] to analog signals. The processor 936 also closes switches SW98 and SW99 so that resistors R93 and R94 do not interfere with the signal V91. Because the PRBS[n] and PRBS'[n] are complementary, their combination functions as an impulse function, which determines the dynamic error or ISI in the DAC elements 948 and 950 when applied to the estimator 524, FIG. 8. During subsequent processing, other DAC elements process the PRBS[n] and PRBS'[n] to determine the dynamic error in these other DAC elements. It is noted that with the addition of the complementary PRBS[n], the resulting additional signal injected into the modulator 800 is very small (mismatch between the DAC elements processing the PRBS[n] and the PRBS'[n]). Therefore, the additional signal does not change the system characteristics to a great extent. It is also noted that with the DAC configuration of FIGS. 8 and 9, the modulus function does not get altered by the addition of the DAC processing the PRBS'[n] and PRBS[n], and the estimated errors are the true representations of the DAC element mismatch.

Figure 10:
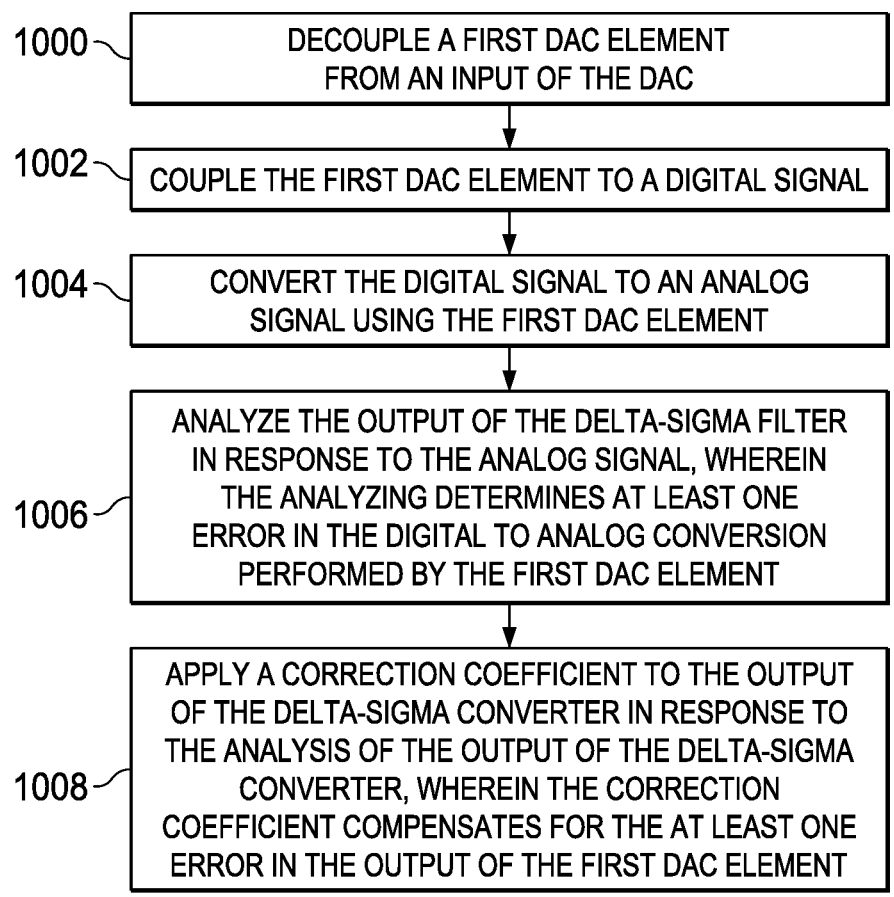
FIG. 10 is a flow diagram illustrating a method of calibrating a digital-to-analog converter.

FIG. 10 is a flow diagram illustrating a method of calibrating a digital-to-analog converter, such as the DAC 506 of FIG. 6. Block 1000 of the flow diagram includes decoupling a first DAC element from an input of the DAC. Block 1002 includes coupling the first DAC element to a digital signal. Block 1004 includes converting the digital signal to an analog signal using the first DAC element. Block 1006 includes analyzing the output of the delta-sigma filter in response to the analog signal, wherein the analyzing determines at least one error in the digital to analog conversion performed by the first DAC element. Block 1008 includes applying a correction coefficient to the output of the delta-sigma converter in response to the analysis of the output of the delta-sigma converter, wherein the correction coefficient compensates for the at least one error in the output of the first DAC element.

While some examples of component sheets and orientation methods have been described in detail herein, it is to be understood that the inventive concepts may be otherwise variously embodied and employed and that the appended claims are intended to be construed to include such variations except insofar as limited by the prior art.

What is claimed is:

1. A digital-to-analog converter comprising:
an adder having a plurality of inputs and an output, the output of the adder being coupled to the output of the converter;
a plurality of digital-to-analog (DAC) elements, each DAC element having an output coupled to an input of the adder, and each DAC element having a DAC element input; and
a plurality of comparators, the output of each comparator coupled to a single DAC element input, a first input of each comparator coupled to the input of the converter, a second input of each comparator selectively coupled to one of a predetermined voltage input and a pseudo-random bit sequence (PRBS[n]) input.

2. The converter of claim 1, further comprising a processor operable to select which of the plurality of comparator second inputs is selectively coupled to the predetermined voltage input or to the PRBS[n] input.

3. The converter of claim 2, wherein the processor is operable to a couple a second input of one of the plurality of comparators to the PRBS[n] input while decoupling the second input of the one comparator from the predetermined voltage input.

4. The converter of claim 2, wherein the processor is operable to selectively couple a second input of a first comparator to the PRBS[n] input and concurrently selectively couple a second input of a second comparator to the complement of the PRBS[n] input.

5. The converter of claim 1, further comprising a resistive network having a plurality of nodes, each node providing a predetermined voltage selectively coupled to each of the second inputs of the plurality of comparators.

6. The converter of claim 5, further comprising a plurality of switches, each switch coupled in parallel with individual resistors in the resistive network, wherein the individual switches are operable to shunt individual resistors coupled to second inputs of comparators.

7. The converter of claim 1, further comprising a resistive network operable to provide the plurality of predetermined voltages, wherein the second input of each comparator is selectively coupled to: at least one predetermined voltage of the resistive network, the PRBS[n] input, or the complement of the PRBS[n] input.

8. The converter of claim 7, further comprising a plurality of switches, each switch coupled in parallel with individual resistors in the resistive network, wherein the individual switches are operable to shunt individual resistors coupled to second inputs of comparators having second inputs coupled to the PRBS[n] input or the complement of the PRBS[n] input.

9. A delta-sigma modulator comprising:
a loop filter having a filter input and a filter output;
a digital signal generator operable to generate a digital signal;
a digital-to-analog converter (DAC) comprising:
a digital input coupled to the filter output;
an analog output coupled to the filter input;
a plurality of comparators, each comparator having a first input coupled to the digital input and each comparator having a second input selectively coupled to one of the digital signal and a predetermined voltage;
a plurality of DAC elements, the input of each DAC element coupled to an output of one of the plurality of comparators and the outputs of the plurality of DAC elements coupled to the analog output; and a corrector coupled to the filter output, the corrector operable to apply a correction coefficient to the filter output; and an estimator coupled to the corrector and the digital signal generator, the estimator operable to generate the correction coefficient in response to a comparator being coupled to the digital signal and decoupled from the predetermined voltage.

10. The modulator of claim 9, further comprising a decimation filter coupled between the corrector and the estimator.

11. The modulator of claim 9, wherein the digital signal generator is a pseudo random bit sequence generator and the digital signal is a pseudo random bit sequence.

12. The modulator of claim 9, wherein the correction coefficient compensates for errors caused by at least one DAC element.

13. The modulator of claim 12, wherein the correction coefficient compensates for static errors in at least one DAC element.

14. The modulator of claim 12, wherein the correction coefficient compensates for dynamic errors in at least one DAC element.

15. The modulator of claim 9, further comprising switches operable to selectively couple the second input of a first comparator to the digital signal and selectively couple the second input a second comparator to the complement of the digital signal, and wherein the estimator is operable to generate the correction coefficient in response to the output of a first DAC element coupled to the output of the first comparator and the output of a second DAC element coupled to the output of the second comparator.

16. A method of calibrating a delta-sigma modulator having a delta sigma filter and a feedback digital-to-analog converter (DAC) having a plurality of DAC elements, the method comprising:
decoupling a first DAC element from an input of the DAC;
coupling the first DAC element to a digital signal;
converting the digital signal to an analog signal using the first DAC element;
analyzing the output of the delta-sigma filter in response to the analog signal, the analyzing determining at least one error in the digital-to-analog conversion performed by the first DAC element; and
applying a correction coefficient to the output of the delta-sigma filter in response to the analysis of the output of the delta-sigma filter, the correction coefficient compensating for the at least one error in the output of the first DAC element.

17. The method of claim 16, wherein the digital signal is a pseudo-random bit sequence.

18. The method of claim 16, further comprising:
recoupling the first DAC element to the input of the DAC;
decoupling a second DAC element from an input of the DAC;
coupling the second DAC element to the digital signal;
converting the digital signal to an analog signal using the second DAC element; and
analyzing the output of the delta-sigma filter in response to the analog signal generated by the second DAC element, the analyzing determining at least one error in the digital-to-analog conversion performed by the second DAC element; and
wherein the applying further includes applying a correction coefficient to the output of the delta-sigma filter in response to the analyzing, the correction coefficient compensating for the at least one error generated by the second DAC element.

19. The method of claim 16 further comprising:
decoupling a second DAC element from an input of the DAC;
coupling the second DAC element to the complement of the digital signal;
converting the complement of the digital signal to an analog signal using the second DAC element;
adding the analog signal generated by the first DAC element to the analog signal generated by the second DAC element to generate a cumulative analog signal;
analyzing the output of the delta-sigma filter in response to the cumulative analog signal, the analyzing determining at least one error in the digital-to-analog conversion performed by the first DAC element and the second DAC element; and
wherein applying a correction coefficient includes applying a correction signal to the output of the delta-sigma filter in response the analysis of the output of the delta-sigma filter in response to the cumulative analog signal.

* * * * *